United States Patent [19]

Maeda et al.

[11] Patent Number: 5,055,549
[45] Date of Patent: Oct. 8, 1991

[54] PROCESS FOR PREPARING PHOTOSENSITIVE HEAT-RESISTANT POLYMER

[75] Inventors: Hirotoshi Maeda, Yokohama; Kouichi Kunimune, Ichihara, both of Japan

[73] Assignee: Chisso Corporation, Osaka, Japan

[21] Appl. No.: 461,985

[22] Filed: Jan. 8, 1990

[30] Foreign Application Priority Data

Jan. 18, 1989 [JP]   Japan ................................. 1-8931
Apr. 18, 1989 [JP]   Japan ................................. 1-98124

[51] Int. Cl.$^5$ ............................................. C08G 69/08
[52] U.S. Cl. ..................................... 528/310; 528/305;
528/125; 528/126; 528/172; 528/176; 528/179;
528/182; 528/188; 528/192; 528/220; 528/222;
528/224; 528/226; 528/229; 528/312; 528/313;
528/322; 525/422; 525/426
[58] Field of Search ............... 528/220, 222, 224, 226,
528/229, 310, 312, 313, 322, 125, 126, 172, 176,
179, 182, 188, 192, 30; 525/422, 426

[56] References Cited

U.S. PATENT DOCUMENTS 4,551,522  11/1985  Inyd et al. ............................ 528/351
4,645,823   2/1987  Ai et al. ................................ 528/26

FOREIGN PATENT DOCUMENTS 62-265326  11/1987  Japan .................................... 528/26

Primary Examiner—John Kight, III
Assistant Examiner—P. Hampton-Hightower
Attorney, Agent, or Firm—Fred Philpitt

[57] ABSTRACT

The present invention is connected with a process for preparing a novel photosensitive polyimide precursor having excellent shelf stability and high sensitivity and containing less impurities.

The process for preparing a photosensitive heat-resistant polymer containing a repeating unit represented by the formula (III) comprises the step of reacting a photosensitive group-containing isoimide represented by the formula (I) with a diamine represented by the formula (II) at a temperature of 0° to 100° C. in the presence of a solvent:

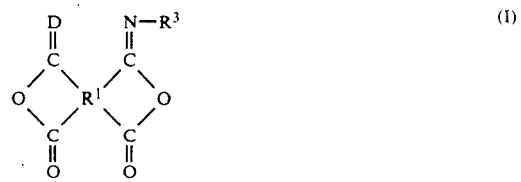

(I)

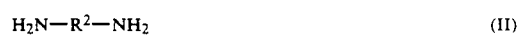

(II)

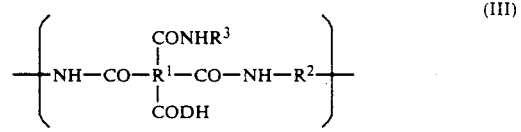

(III)

wherein $R^1$ is independently a tetravalent carbon cyclic aromatic group or heterocyclic group; $R^2$ is independently an aliphatic group having at least 2 carbon atoms, an alicyclic group, an aromatic aliphatic group, a carbon cyclic aromatic group, a heterocyclic group or a polysiloxane group; $R^3$ is a monovalent organic group having a photosensitive unsaturated group; and D is an oxygen atom or $=N-R^3$.

8 Claims, No Drawings

PROCESS FOR PREPARING PHOTOSENSITIVE HEAT-RESISTANT POLYMER

BACKGROUND OF THE INVENTION (1) Field of the Invention

The present invention relates to a process for preparing a photosensitive heat-resistant polymer. More particularly, the present invention relates to a process for preparing a photosensitive polyimide precursor having excellent shelf stability and high sensitivity and containing less impurities.

(2) Description of the Prior Art

As heat-resistant photosensitive materials, photosensitive polyimides are widely used as raw materials for insulating films of semiconductors and for passivation films. For example, in Japanese Patent Laid-open Publication No. 145794/1979, a method is suggested in which a compound containing a double bond and an amino group or its quaternary salt is mixed with polyamic acid. Furthermore, in Japanese Patent Laid-open Publication Nos. 45746/1980 and 100143/1985, other methods are suggested in which an unsaturated epoxy compound or an isocyanate compound having a double bond is reacted with the carboxyl group of each polyamic acid. Japanese Patent Publication No. 41422/1980 discloses a polymer in which an active functional group such as a double bond is introduced into the ester side chain of polyamic acid. In addition, Japanese Patent Laid-open Publication No. 6729/1985 discloses a method for synthesizing a polyimide by the use of a diamine having a double bond which has been previously synthesized.

The method described in Japanese Patent Laid-open Publication No. 145794/1979 mentioned above has the drawback that since a great deal of the compound containing the amino group or its quaternary salt is added to the unstable polyamic acid solution, the viscosity of the solution changes noticeably with time. The techniques in Japanese Patent Laid-open Publication Nos. 45746/1980 and 100143/1985 have the drawback that when the compound having the photosensitive unsaturated group is reacted with the carboxyl group of the polyamic acid, the viscosity of the solution changes owing to the partial decomposition of the polyamic acid and the like. In Japanese Patent Publication No. 41422/1980, an acid chloride is reacted with a diamine, but after the reaction, the chloride remains as an impurity, and the removal of this impurity is troublesome. Furthermore, in Japanese Patent Laid-open Publication No. 6729/1985, the process for the introduction of the photosensitive functional group is complicated, and much cost is required. As understood from the foregoing, the conventional techniques have a variety of the problems, and so it is demanded to develop photosensitive materials without such problems.

SUMMARY OF THE INVENTION

An object of the present invention is to provide a novel process for easily preparing a photosensitive polyimide precursor having excellent shelf stability and high sensitivity and containing less impuries.

The first feature of the present invention is directed to a process for preparing a photosensitive heat-resistant polymer containing a repeating unit represented by the formula (III) which comprises the step of reacting a photosensitive group-containing isoimide represented by the formula (I) with a diamine represented by the formula (II) at a temperature of 0° to 100° C. in the presence of a solvent:

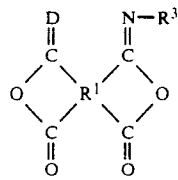 (I)

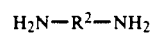 (II)

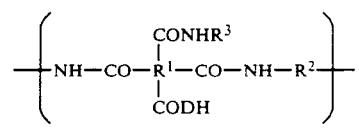 (III)

wherein $R^1$ is independently a tetravalent carbon cyclic aromatic group or hetrocyclic group; $R^2$ is independently an aliphatic group having at least 2 carbon atoms, an alicyclic group, an aromatic aliphatic group, a carbon cyclic aromatic group, a heterocyclic group or a polysiloxane group; $R^3$ is a monovalent organic group having a photosensitive unsaturated group; and D is an oxygen atom or $=N-R^3$.

The second feature of the present invention is directed to a process for preparing a photosensitive heat-resistant polymer according to the first feature wherein the photosensitive group-containing isoimide represented by the formula (I) is obtained by first synthesizing an amic acid from a tetracarboxylic dianhydride represented by the formula (IV) and a monoamine having the photosensitive group represented by the formula (V), and then dehydrating the thus synthesized amic acid with a dehydrating agent such as N,N'-dicyclohexylcarbodiimide or trifluoroacetic anhydride:

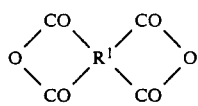 (IV)

 (V)

The third feature of the present invention is directed to a process for preparing a photosensitive heat-resistant polymer according to the first feature wherein $R^1$ is independently one selected from the group consisting of a non-substituted monocyclic aromatic group, a non-substituted condensed polycyclic aromatic group and a non-substituted non-condensed dicyclic aromatic group.

The fourth feature of the present invention is directed to a process for preparing a photosensitive heat-resistant polymer according to the first feature wherein $R^2$ is independently one selected from the group consisting of a monocyclic aromatic group, a non-condensed dicyclic aromatic group, a non-substituted monocyclic aromatic aliphatic group and a non-substituted aliphatic group having 2 to 10 carbon atoms.

The fifth feature of the invention is directed to a process for preparing a photosensitive heat-resistant polymer according to the first feature wherein when the photosensitive group-containing isoimide represented by the formula (I) is reacted with the diamine represented by the formula (II), an aminosilane represented by the formula (VII) is introduced into a terminal of the polymer:

$$NH_2-R^7-SiR^8{}_{3-k}X_k \qquad (VII)$$

wherein $R^7$ is $-(CH_2)_s-$,

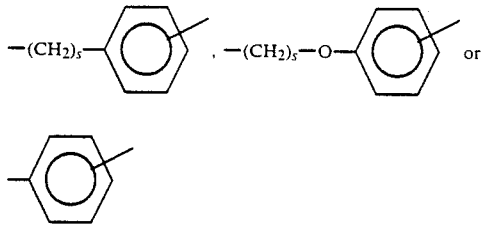

wherein s is an integer of 1 to 4, $R^8$ is independently an alkyl group having 1 to 6 carbon atoms, a phenyl group or an alkyl-substituted phenyl group having 7 to 12 carbon atoms, X is independently a hydrolytic alkoxy group, an acetoxy group or a halogen, and k is a value of $1 \leqq k \leqq 3$.

The sixth feature of of the present invention is directed to a process for preparing a photosensitive heat-resistant polymer according to the first feature wherein when the photosensitive group-containing isoimide represented by the formula (I) is reacted with the diamine represented by the formula (II), a reaction temperature is from 10° to 30° C.

The seventh feature of the present invention is directed to a process for preparing a photosensitive heat-resistant polymer according to the first feature wherein when the photosensitive group-containing isoimide represented by the formula (I) is reacted with the diamine represented by the formula (II), a reaction time is from 0.2 to 30 hours.

The eighth feature of the present invention is directed to a process for preparing a photosensitive heat-resistant polymer according to the first feature wherein when the photosensitive group-containing isoimide represented by the formula (I) is reacted with the diamine represented by the formula (II), a reaction time is from 1 to 10 hours.

DETAILED DESCRIPTION OF THE INVENTION

A photosensitive polymer of the present invention can be prepared by reacting a photosensitive group-containing isoimide represented by the formula (I) with a diamine represented by the formula (II) preferably at a temperature of 0° to 100° C. in the presence of a solvent.

The photosensitive group-containing isoimide represented by the formula (I) can be easily prepared in accordance with a process described in "Proceeding of Second International Conference on Polyimides", p. 631 (1985) from an amic acid which can be synthesized from a tetracarboxylic dianhydride and a monoamine having a photosensitive group. Here, the tetracarboxylic dianhydride and the monoamine having the photosensitive group are represented by the following formulae (IV) and (V), respectively, and detailed reference will be made to the synthesis method of the photosensitive group-containing isoimide represented by the formula (I):

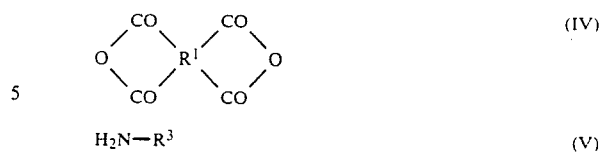

When $R^1$ is a carbon cyclic aromatic group, this group $R^1$ preferably has at least one six-membered ring. In particular, $R^1$ is a polycyclic aromatic group having a monocyclic aromatic group, a condensed polycyclic aromatic group or several condensed rings or non-condensed rings (these rings are combined with each other directly or via a crosslinking group).

Suitable examples of the crosslinking group are as follows:

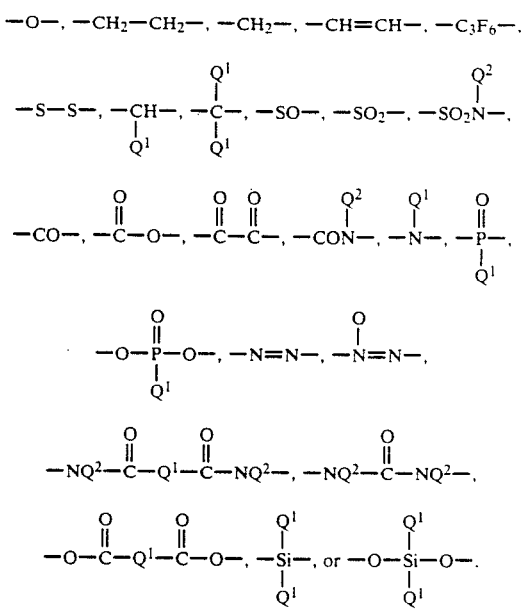

In the above-mentioned formulae, $Q^1$ is an alkyl group or an alkylene group non-substituted or substituted by one or more halogen atoms (preferably fluorine atoms) and having 1 to 6 carbon atoms, preferably 1 to 4 carbon atoms, or $Q^1$ is a cycloalkyl group, an aryl group or an arylene group.

$Q^2$ is a hydrogen atom, a cycloalkyl group, an aryl group or an alkyl group non-substituted or substituted by one or more halogen atoms and having 1 to 4 carbon atoms.

Furthermore, each of $Q^1$ and $Q^2$ may be a group comprising the above-mentioned groups which are combined with the interposition of two crosslinking groups, e.g., two $-SO_2-$groups.

In the case that $R^1$ is a heterocyclic group, an example of the heterocyclic group is a heterocyclic aromatic group of a five-membered or a six-membered ring containing oxygen, nitrogen and/or sulfur, or a condensed cyclic group of the above-mentioned heterocyclic aromatic group and a benzene nucleus.

The carbon cyclic aromatic group or the heterocyclic group which $R^1$ represents may be substituted by, for example, one or more of a nitro group, an alkyl group having 1 to 4 carbon atoms, a trifluoromethyl group, a halogen atom (particularly a fluorine atom), a silyl group or a sulfamoyl group.

The group which R¹ represents may be non-substituted or may be substituted by, for example, one or more of a halogen atom (e.g., fluorine, chlorine or bromine), or an alkyl group or an alkoxy group having 1 to 4 carbon atoms.

With regard to R¹, it is preferred that each R¹ is independently a non-substituted monocyclic aromatic group, a non-substituted condensed polycyclic aromatic group or a non-substituted non-condensed dicyclic aromatic group. In the case of this non-substituted non-condensed dicyclic aromatic group, the aromatic rings are combined with each other via a crosslinking group such as —O— or —CO—.

Exemplary compounds of the tetracarboxylic dianhydride represented by the above-mentioned formula (IV) are as follows:

Pyromellitic dianhydride,
3,3',4,4'-benzophenone-tetracarboxylic dianhydride,
2,3,3',4'-benzophenone-tetracarboxylic dianhydride,
2,2',3,3'-benzophenone-tetracarboxylic dianhydride,
3,3'4,4'-diphenyl-tetracarboxylic dianhydride,
2,2',3,3'-phenyl-tetracarboxylic dianhydride,
bis (2,3-dicarboxyphenyl)-methane dianhydride,
bis(3,4)-dicarboxyphenyl)-methane dianhydride,
2,2-bis(2,3-dicarboxyphenyl)-propane dianhydride,
bis(3,4-dicarboxyphenyl)-ether dianhydride,
bis(3,4-dicarboxyphenyl)-ether dianhydride,
N,N-(3,4-dicarboxyphenyl)-N-methylamine dianhydride,
3,3',4,4'-tetracarboxybenzoyloxybenzene dianhydride,
2,3,6,7-naphthalene-tetracarboxylic dianhydride,
1,2,5,6-naphthalene-tetracarboxylic dianhydride, and
thiophene-2,3,4,5-tetracarboxylic dianhydride.

Examples of R³ are as follows:

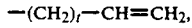

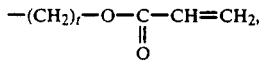

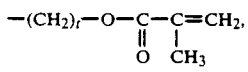

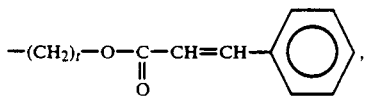

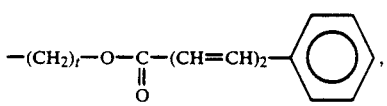

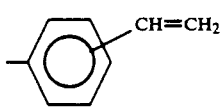

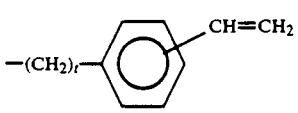

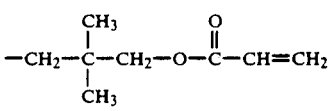

-continued
—(CH₂)ₜ—NH—CO—CH=CH₂ and

—(CH₂)ₜ—NH—CO—C=CH₂
                    |
                    CH₃ wherein t is a value of 1, 2 or 3.

In the presence of the same solvent as preferably used in preparing the photosensitive polymer of the present invention, the amic acid can be synthesized from the above-mentioned acid anhydride and the monoamine in a known manner. The thus synthesized amic acid can be easily converted into a polyisoimide by, for example, a dehydrating agent such as N,N'-dicyclohexylcarbodiimide, trifluoroacetic acid anhydride and the like in accordance with the method described in the above-mentioned "Proceeding of Second International Conference on Polyimides", p. 631 (1985). In this case, an imide group is formed partly, depending upon reaction conditions.

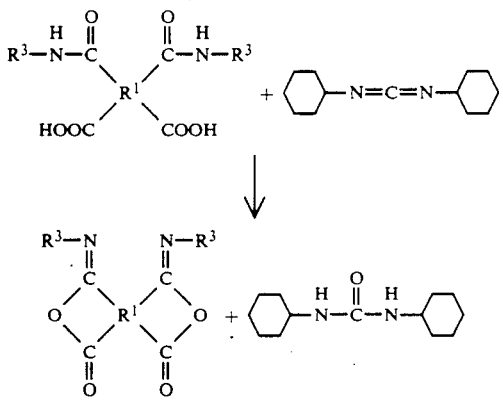

The reaction of N,N'-dicyclohexylcabodiimide as the dehydrating agent with the amic acid is shown hereinbefore, but it is not always necessary that all of amic acid is converted into the isoimide. However, when the amount of the isoimide decreases, the number of the photosensitive group in the finally obtained photosensitive polymer also decreases, with the result that the sensitivity of the polymer deteriorates. In consequence, it is preferable that the conversion of amic acid into the isoimide is accomplished as much as possible.

Next, this isoimide is reacted with the diamine represented by the formula (II) to synthesize photosensitive polymer. Reaction temperature is in the range of 0° to 100° C., preferably about 10° to 30° C. Reaction time is in the range of 0.2 to 30 hours, preferably about 1 to 10 hours.

In the case that R² is a carbon cyclic aromatic group, a preferable example of the carbon cyclic aromatic group is a monocyclic aromatic group, a condensed polycyclic aromatic group or a non-condensed dicyclic aromatic group. In the case of this non-condensed dicyclic aromatic group, the aromatic rings are combined with each other via a crosslinking group. Examples of the crosslinking group are the same as recited in the description regarding R¹.

In the case that R² is a heterocyclic group, an example of the heterocyclic group is particularly a heterocyclic aromatic group of a five-membered or a six-membered ring containing oxygen, nitrogen and/or sulfur.

In the case that $R^2$ is an aliphatic group, an example of the aliphatic group is particularly an alkylene group having 2 to 12 carbon atoms, or another alkylene group in which a heteroatom such as oxygen, sulfur or nitrogen is present in the alkylene chain.

In the case that $R^2$ is an alicyclic group, an example of the alicyclic group is a cyclohexyl group or a dicyclohexylmethane group. Moreover, in the case that $R^2$ is an aromatic aliphatic group, an example of the aromatic aliphatic group is particularly a 1,3-, 1,4- or 2,4-bis-alkylene benzene group, a 4,4'-bis-alkylene-diphenyl group or a 4,4'-bis-alkylene-diphenyl ether group.

With regard to $R^2$, it is preferred that each $R^2$ is independently a monocyclic aromatic group or a non-condensed dicyclic aromatic group substituted by one or more halogen atoms or one or more alkyl groups or alkoxy groups each having 1 to 4 carbon atoms, or a non-substituted monocyclic aromatic aliphatic group or a non-substituted aliphatic group having 2 to 10 carbon atoms.

In the case that $R^2$ is a polysiloxane group, this group can be represented by the formula (VI):

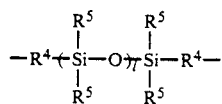

wherein $R^4$ is independently $-(CH_2)_s-$,

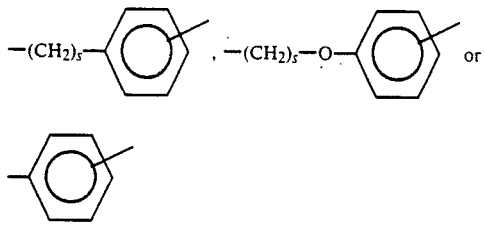

wherein s is an integer of 1 to 4, $R^5$ is independently an alkyl group having 1 to 6 carbon atoms, a phenyl group or an alkyl-substituted phenyl group having 7 to 12 carbon atoms, l is a value of $1 \leq l \leq 100$.

As the diamines represented by the above-mentioned formula (II), known compounds are used.

Exemplary compounds of the carbon cyclic aromatic diamines are particularly as follows:

o-, m- and p-Phenylenediamine, diaminotoluenes (e.g., 2,4-diaminotoluene), 1,4-diamino-2-methoxybenzene, 2,5-diaminoxylenes, 1,3-diamino-4-chlorobenzene, 1,4-diamino-2,5-dichlorobenzene, 1,4-diamino-2-bromobenzene, 1,3-diamino-4-isopropylbenzene, N,N'-diphenyl-1,4-phenylenediamine, 4,4'-diaminodiphenyl-2,2-propane, 4,4'-diaminodiphenylmethane, 2,2'-diaminostilbene, 4,4'-diaminostilbene, 4,4'-diamino diphenyl ether, 4,4'-diamino diphenyl thioether, 4,4'-diaminodiphenylsulfone, 3,3'-diamindiphenylsulfone, 4,4'-diaminobenzoic phenyl ester, 2,2'-diaminobenzophenone, 4,4',-diaminobenzophenone, 4,4'-diaminobenzyl, 4-(4'-aminophenylcarbamoyl)-aniline, bis(4-aminophenyl)phosphine oxide, bis(4-aminophenyl)-methyl-phosphine oxide, bis(3-aminophenyl)-methylsulfine oxide, bis(4-aminophenyl)-phenylphosphine oxide, bis(4-aminophenyl)-cyclohexylphosphine oxide, N,N-bis(4-aminophenyl)-N-phenylamine, N,N-bis(4-aminophenyl)-N-methylamine, 4,4'-diaminodiphenyl urea, 1,8-diaminonaphthalene, 1,5-diaminonaphthalene, 1,5-diaminoanthraquinone, diaminofluoranthene, bis(4-aminophenyl)-diethylsilane, bis(4-aminophenyl)-dimethylsilane, bis(4-aminophenyl)-tetramethyldisiloxane, 3,4'-diaminodiphenyl ether, benzidine, 2,2'-dimethylbenzidine, 2,2-bis[4-(4-aminophenoxy)phenyl]propane, bis[4-(4-aminophenoxy)phenyl]surface, 4,4'-bis(4-aminophenoxy)biphenyl, 2,2-bis[4-(4aminophenoxy)-phenyl]hexafluoropropane, 1,4-bis(4-aminophenoxy)-benzene and 1,3-bis(4-aminophenoxy)benzene.

Exemplary compounds of the heterocyclic diamines are as follows:

2,6-Diaminopyridine, 2,4-diaminopyrimidine, 2,4-diamino-s-triazine, 2,7-diamino-dibenzofuran, 2,7-diaminocarbazole, 3,7-diaminophenothiazine, 2,5-diamino-1,3,4-thiadiazole and 2,4-diamino-6-phenyl-s-triazine.

Furthermore, exemplary compounds of the aliphatic diamine are as follows:

Dimethyldiamine, trimethylenediamine, tetramethylenediamine, hexamethylenediamine, heptamethylenediamine, octamethylenediamine, nonamethylenediamine, decamethylenediamine, 2,2-dimethylpropylenediamine, 2,5-dimethylhexamethylenediamine, 2,5-dimethylheptamethylenediamine, 4,4-dimethylheptamethylenediamine, 3-methylheptamethylenediamine, 3-methoxyheptamethylenediamine, 5-methylnonamethylenediamine, 2,11-diaminododecane, 1,12-diaminooctadecane, 1,2-bis(3-aminopropoxy)-ethane, N,N'-dimethyll ethylanediamine, N,N'-diethyl-1,3-diaminopropane, N,N'-dimethyl-1,6-diaminohexane and a diamine represented by the formula $H_2N(CH_2)_3O(CH_2)_2O(CH_2)_3NH_2$.

Suitable exemplary compounds of the alicyclic diamine include 1,4-diaminocyclohexane and 4,4'-diamino-dicyclohexylmethane, and suitable exemplary compounds of the aromatic aliphatic diamine include 1,4-bis(2-methyl-4-aminopentyl)-benzene, 1,4-bis(1,1-dimethyl-5-aminopentyl)-benzene, 1,3-bis(aminomethyl)-benzene and 1,4-bis(aminomethyl)-benzene.

Moreover, exemplary compounds of the diaminopolysiloxane are as follows:

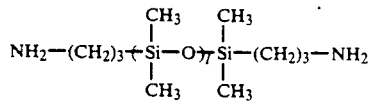

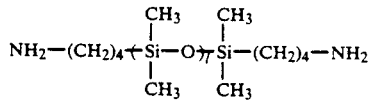

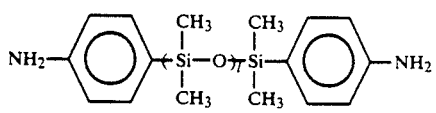

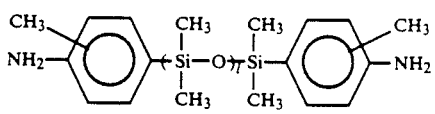

-continued

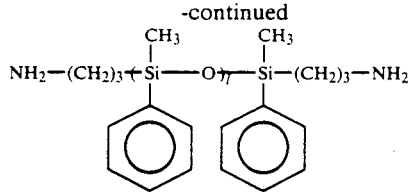

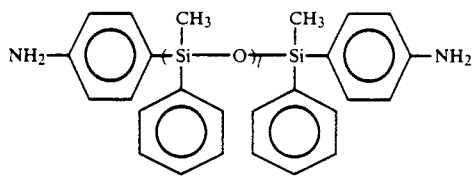

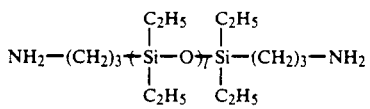

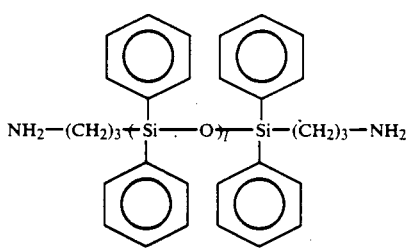

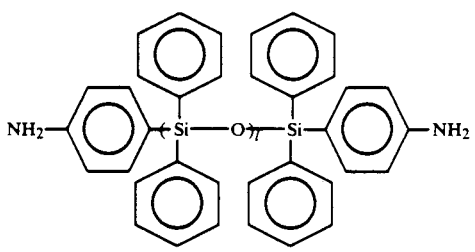

Preferable examples of the solvent (hereinafter referred to as "reaction solvent" at times) for the preparation of the photosensitive polymer of the present invention are as follows:

N-Methyl-2-pyrrolidone, N,N-dimethylacetamide, N,N-dimethylformamide, dimethylsulfoxide, tetramethyl urea, pyridine, dimethylsulfone, hexamethylphosphoramide, methylformamide, N-acetyl-2-pyrrolidone, ethylene glycol monomethyl ether, ethylene glycol monoethyl ether, ethylene glycol monobutyl ether, diethylene glycol monomethyl ether, diethylene glycol monoethyl ether, diethylene glycol dimethyl ether, cyclopentanone, cyclohexanone, cresol, γ-butyrolactone, N,N-diethylacetamide, N,N-diethylformamide, N,N-dimethylmethoxyacetamide, tetrahydrofuran, N-methyl-ε-caprolactam and tetrahydrothiophene dioxide (sulpholane).

Furthermore, the reaction for the preparation of the photosensitive polymer can be carried out in a mixed solvent obtained by mixing two or more kinds of the above-mentioned organic solvents. In addition, the above-mentioned organic solvent, when used, can be diluted with, for example, another non-protonic (neutral) organic solvent such as an aromatic, alicyclic or aliphatic hydrocarbon or its chlorinated derivative (e.g, benzene, toluene, xylenes, cyclohexane, pentane, hexane, petroleum ether or methylene chloride) or dioxane.

In reacting the above-mentioned isoimide with the diamine represented by the formula (II), an aminosilane represented by the following formula (VII) can be introduced into the terminal of the polymer with the intention of improving adhesive properties to the substrate:

$$NH_2-R^7-SiR^8{}_{3-k}X_k \qquad (VII)$$

wherein $R^7$ is $-(CH_2)_s-$,

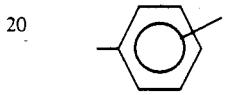

wherein s is an integer of 1 to 4, $R^8$ is independently an alkyl group having 1 to 6 carbon atoms, a phenyl group or an alkyl-substituted phenyl group having 7 to 12 carbon atoms, X is independently a hydrolytic alkoxy group, an acetoxy group or a halogen, and k is a value of $1 \leq k \leq 3$.

Exemplary compounds of the aminosilane represented by the formula (VII) are as follows:

Aminomethyl-di-n-propoxy-methylsilane, (β-aminoethyl)di-n-propoxy-methylsilane, (β-aminoethyl)-diethoxy-phenyl-silane, (β-aminoethyl)-tri-n-propoxysilane, (β-aminoethyl)dimethoxy-methylsilane, (γ-aminopropyl)-di-n-propoxy-methylsilane, (γ-aminopropyl-di-n-butoxy-methylsilane, (γ-aminopropyl)-trimethoxysilane, (γ-aminopropyl)-triethoxysilane, (γ-aminopropyl)-di-n-pentoxy-phenylsilane, (γ-aminopropyl)-methoxy-n-propoxy-methylsilane, (δaminobutyl)-dimethoxymethylsilane, (3-aminophenyl -di-n-propoxymethylsilane, (4-aminophenyl)-tri-n-propoxysilane, [β-(4-aminophenyl)ethyl]diethoxy-methylsilane, [β-(3-aminophenyl)-ethyl]-din-propxy-phenylsilane, [γ-(4-aminophenyl -propyl]-di-n-propoxy-methylsilane, [γ-(4-aminophenoxy)-propyl]-di-n-propoxy-methylsilane, [γ-(3-aminophenoxy)-propyl]-di-n-butoxy-methylsilane, (γ-aminopropyl)-methyl-dimethoxysilane, (γ-aminopropyl)-methyl-diethoxysilane, (γ-aminopropyl)-ethyl-di-n-propoxysilane, 4-aminophenyl-trimethoxysilane, 3-aminophenyltrimethoxysilane, 4-aminophenylmethyl-di-methoxysilane, 3-aminophenyl-di-methylmethoxysilane and 4-aminophenyl-tri-ethoxysilane.

In addition, with the intention of controlling the molecular weight of the photosensitive polymer, a monofunctional acid anhydride or an amine is used at the time of the reaction. Exemplary compounds of the monofunctional acid anhydride or the amine include phthalic anhydride, maleic anhydride, aniline and allylamine.

In the thus synthesized photosensitive polymer, the amount of impurities is such that there is no problem in practice.

The photosensitive polymer synthesized by the preparation process of the present invention can be stored in the state of a solution, and it can be also stored likewise in the solid state of powder or masses which are prepared by adding the polymer solution to a great deal of a non-solvent so as to deposit the polymer, and then filtering and drying the deposited polymer.

The photosensitive polymer synthesized by the preparation process of the present invention is practically used in the state of a photosensitive polymer composition prepared by dissolving the following component (a), (b), (c) and (d) in a solvent.

(a) Photosensitive polymer

This polymer contains the repeating unit represented by the general formula (III), but this repeating unit need not occupy 100% of all the repeating units. However, in practice, it is preferred that the repeating unit of the general formula (III) is present in a ratio of 30 mole% or more of all the repeating units. The repeating units other than the repeating unit represented by the general formula (III) are not particularly limited, but they practically comprise one or more kinds of the following repeating units:

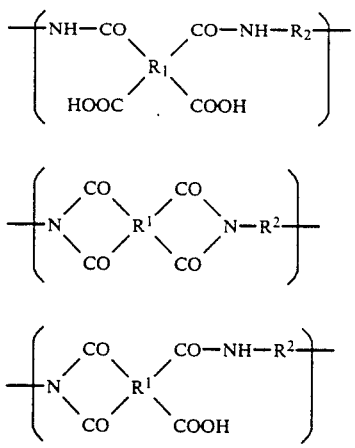

The concentration of the photosensitive polymer in the photosensitive polymer composition is in the range of 2 to 50% by weight, preferably 10 to 30% by weight.

(b) Photopolymerization initiator or sensitizer

Examples of these agents thereof are as follows:

Benzoin, benzoin ether, benzophenone, p,p'-dimethyl benzophenone, 4,4'-bis(diethylamino benzophenone), Michler's ketone, 2-nitrofluorene, 5-nitroacenaphthene, 4-nitro-1-naphthylamine, anthrone, 1,9-benzanthrone, dibenzal acetone, anthraquinone, 2-methylanthraquinone, 1-nitropyrene, 1,8-dinitropyrene, pyrene-1,6-quinone, cyanoacridine, benzoquinone, 1,2-naphthoquinone, 1,4-naphthoquinone and 1,2-benzanthraquinone.

These compounds may be used singly or in combination.

The amount of the photopolymerization initiator or sensitizer is in the range of 0 to 20% by weight, preferably 0 to 10% by weight based on the photosensitive polymer.

5 (c) Diazide compound

Examples of this compound are as follows:

2,6-Di(p-azidobenzal)-4-methylcyclohexanone, 2,6-di(pazidobenzal)cyclohexanone, 4,4'-diazidochalcone, 4,4'-diazidochalcone, 4,4'diazidobenzal acetone, 4,4'-diazidostilbene, 4,4'-diazido benzophenone, 4,4'-diazidodiphenylmethane and 4,4'-diazidodiphenylamine.

These diazide compounds may be used singly or in combination.

The amount of the diazide compound is in the range of 0 to 50% by weight, preferably 0 to 20% by weight based on the photosensitive polymer.

(d) Compound having the carbon-carbon double bond

Examples of this kind of compound are as follows:

Butyl acrylate, cyclohexyl acrylate, dimethylaminoethyl methacrylate, benzyl acrylate, Carbitol acrylate, 2-ethylhexyl acrylate, 2-ethylhexyl methacrylate, lauryl methacrylate, 2-hydroxyethyl acrylate, 2-hydroxyethyl methacrylate, 2-hydroxypropyl acrylate, 2-hydroxypropyl methacrylate, glycidyl methacrylate, N-methylolacrylamide, N-diacetoneacrylamide, N,N'-methylenebisacrylamide, N-vinylpyrrolidone, ethylene glycol diacrylate, diethylene glycol diacrylate, triethylene glycol diacrylate, butylene glycol diacrylate, butylene glycol dimethacrylate, neopentyl glycol diacrylate, neopentyl glycol dimethacrylate, 1,4-butanediol diacrylate, 1,6-hexanediol diacrylate, 1,6-hexanediol dimethacrylate, pentaerythritol diacrylate, pentaerythritol triacrylate, trimethylolpropane triacrylate and trimethylolpropane trimethacrylate.

These compounds may be used singly or in combination.

The amount of the compound (d) having the carbon-carbon double bond is in the range of 0 to 10% by weight, preferably 0 to 5% by weight based on the photosensitive polymer.

In the present invention, secondary materials such as a crosslinking agent, a dye and a pigment can be additionally used. The crosslinking agent is, for example, a known polyvalent thiol such as pentaerythritol tetra(3-mercapto propionate) or pentaerythritol tetra(mercapto acetate), and it is used in an amount of 10% by weight or less based on the photosensitive polymer.

The photosensitive polymer composition of the present invention can be obtained by dissolving the compounds (a), (b), (c) and (d) in the above-mentioned reaction solvent in the aforesaid ratio.

Next, reference will be made to a method for forming a resist pattern by the use of the polymer composition of the present invention.

The polymer composition of the present invention can be applied onto a substrate such as a silicone wafer, a metallic plate, a plastic plate or a glass plate in accordance with a known means such as spin coating, immersion or spray printing. The coating film on the substrate is then prebaked at a temperature of 30° to 150° C. for a period of several minutes to several tens minutes by the use of a heating means such as an electric furnace or a hot plate so as to remove most of the solvent therefrom. Afterward, a negative mask is put on the coating film, and the latter is then irradiated with chemical rays through the mask. Examples of the chemical rays include X-rays, electron beams, ultraviolet rays and visible light, and above all, the ultraviolet rays are particularly preferable. Then, the unexposed portions of the film are dissolved in and removed by a developing solution therefrom, thereby obtaining a relief pattern. The developing solution can be selected from the above-mentioned reaction solvents, and a mixture of the solvent and a lower alcohol such as methanol, ethanol or propanol which is the non-solvent for the photosensitive polymer of the present invention may be also used as the developing solution. If desired, the relief pattern is rinsed with the above-mentioned non-solvent, and if desired, it is further dried at a temperature of 150° C. or less, whereby the relief pattern can be stabilized. Moreover, the coating film can be peeled from the substrate at an optional step after the prebaking process, and it can be used as a single film. The polymer of the relief pattern formed by the development is in the form of a precursor, and therefore it is then heated at a temperature of 200° to 500° C., preferably 300° to 400° C. for a period of several tens minutes to several hours, so that the patterned polyimide film is formed. In this case, chemical reaction makes progress as follows, and it is apparent that the photosensitive component is volatilized by the thermal decomposition to form the polyimide:

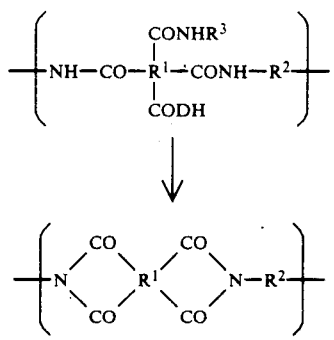

The present invention permits easily introducing a photosensitive group into a polyimide precursor, and a photosensitive polymer composition prepared by adding suitable additives to the obtained photosensitive polymer has practically sufficient sensitivity and shelf stability, and contains less impurities.

The photosensitive polymer prepared by the process of the present invention can be used to obtain patterned heat-resistant polyimide films.

The photosensitive polymer synthesized by the process of the present invention and the resist patterns thereof are applicable as electronic materials, particularly as materials for passivation films of semiconductors, print circuits and the like.

EXAMPLES

The present invention will be described in detail in reference to examples, but the scope of the present invention should not be limited by these examples.

Example 1

A 1-liter flask equipped with a stirrer, a dropping funnel, a thermometer, a condenser and a nitrogen-replacing device was fixed to a thermostatic chamber. In this flask were placed 500 g of dehydrated and purified N-methyl-2-pyrrolidone (hereinafter referred to simply as "NMP") and 31.99 g (0.560 mol) of allylamine. While the solution was stirred, 90.27 g (0.280 mol) of 3,3',4,4'-benzophenonetetracarboxylic dianhydride (hereinafter referred to simply as "BTDA") was then added thereto, and reaction was carried out at 30° to 40° C. for 2 hours. To this solution was added 115.61 g (0.560 mol) of N,N'-dicyclohexylcarbodiimide (hereinafter referred to simply as "DCC"), and reaction was then carried out at 20° to 30° C. for 4 hours, whereby white N,N'-dicyclohexyl urea was deposited and the solution of isoimide was obtained. Afterward, 52.35 g (0.261 mol) of 4,4'-diamino diphenyl ether (hereinafter referred to simply as "DDE") and 2.13 g (0.037 mol) of allylamine were added to the above-mentioned isoimide solution, and the mixture was then subjected to reaction at a temperature of 20° to 30° C. for 5 hours.

The resulting white precipitate was removed from the reaction solution by filtration, and the filtrate was then added dropwise to a great deal of acetone, so that a photosensitive polymer was deposited in which allylamine was added to its terminal. This deposit was collected by filtration and then dried overnight at 50° C. under reduced pressure, thereby isolating the photosensitive polymer.

Example 2

By the use of the same procedure and devices as in Example 1, 22.85 g (0.400 mol) of allylamine was dissolved in 500 g of N,N'-dimethylacetamide, and 64.49 g (0.200 mol) of BTDA was added thereto with stirring and reaction was then carried out at 30° to 40° C. for 2 hours. Afterward, 82.56 g (0.400 mol) of DCC was added to the solution, and the reaction was further carried out at 20° to 30° C. for 4 hours, so that the white precipitate of N,N'-dicyclohexyl urea was deposited and the solution of isoimide was obtained. Afterward, 83.10 g (0.192 mol) of bis[4-(4-aminophenoxy)phenyl]-sulfone and 3.41 g (0.016 mol) of 4-aminophenylmethoxysilane were added to this solution, and the mixture was then subjected to the reaction at a temperature of 20° to 30° C. for 5 hours. The resulting white precipitate of N,N'-dicyclohexyl urea was removed from the reaction solution by filtration, and the filtrate was then added dropwise to a great deal of acetone, so that a photosensitive polymer was deposited in which silane was added to its terminal. This deposit was collected by filtration and then dried overnight at 50° C. under reduced pressure, thereby isolating the photosensitive polymer.

Example 3

By the use of the same procedure and devices as in Example 1, 28.76 g (0.504 mol) of allylamine was dissolved in 500 g of NMP, and 54.94 g (0.252 mol) of pyromellitic dianhydride was added thereto with stirring and reaction was then carried out at 30° to 40° C. for 2 hours. Afterward, 103.94 g (0.504 mol) of DCC was added thereto, and the reaction was further carried out at 20° to 30° C. for 4 hours, so that the white precipitate of N,N'-dicyclohexyl urea was deposited and the solution of isoimide was obtained. Afterward, 47.07 g (0.235 mol) of DDE and 3.29 g (0.033 mol) of maleic anhydride were added to this solution, and the mixture was then subjected to the reaction at a temperature of 20° to 30° C. for 5 hours. The resulting white precipitate of N,N'-dicyclohexyl urea was removed from the reaction solution by filtration, and the filtrate was then added dropwise to a great deal of acetone, so that a photosensitive polymer was deposited in which maleic anhydride was added to its terminal. This deposit was collected by filtration and then dried overnight at 50° C. under reduced pressure, thereby isolating the photosensitive polymer.

Example 4

By the use of the same procedure and devices as in Example 1, 29.70 g (0.520 mol) of allylamine was dissolved in 500 g of NMP, and 76.53 g (0.260 mol) of 3,3',4,4'-diphenyltetracarboxylic dianhydride was added thereto with stirring and reaction was then carried out at 30° to 40° C. for 3 hours. Afterward, 107.33 g (0.520 mol) of DCC was further added to the solution, and the reaction was further carried out at 20° to 30° C. for 4 hours, so that the white precipitate of N,N'-dicyclohexyl urea was deposited and the solution of isoimide was obtained. Afterward, 28.13 g (0.260 mol) of p-phenylenediamine was added to this solution, and the mixture was then subjected to the reaction at a temperature of 20° to 30° C. for 4 hours. The white precipitate of N,N'-dicyclohexyl urea was removed from the reaction solution by filtration, and the filtrate was then added dropwise to a great deal of acetone, so that a photosensitive polymer was deposited. This deposit was collected by filtration and then dried overnight at 50° C., thereby isolating the photosensitive polymer.

Example 5

By the use of the same procedure and devices as in Example 1, 16.92 g (0.296 mol) of allylamine was dissolved in 500 g of NMP, and 71.59 g (0.222 mol) of BTDA was further added thereto with stirring and reaction was then carried out at 30° to 40° C. for 2 hours. Afterward, 61.12 g (0.296 mol) of DCC was added to this solution, and the reaction was further carried out at a temperature of 20° to 30° C. for 4 hours, so that the white precipitate of N,N'-dicyclohexyl urea was deposited and the solution of isoimide was obtained. Afterward, 44.48 g (0.222 mol) of DDE was added to this solution, and the mixture was then subjected to the reaction at a temperature of 20° to 30° C. for 5 hours. The white precipitate of N,N'-dicyclohexyl urea was removed from the reaction solution by filtration, and the filtrate was then added dropwise to a great deal of acetone, so that a photosensitive polymer was deposited. This deposit was collected by filtration and then dried overnight at 50° C., thereby isolating the photosensitive polymer.

Example 6

By the use of the same procedure and devices as in Example 1, 29.34 g (0.514 mol) of allylamine was dissolved in 500 g of diethylene glycol dimethyl ether, and 82.78 g (0.257 mol) of BTDA was further added thereto and reaction was then carried out at 30° to 40° C. for 2 hours. Afterward, 106.02 g (0.514 mol) of DCC was added to this solution, and the reaction was further carried out at a temperature of 20° to 30° C. for 4 hours, so that the white precipitate of N,N'-dicyclohexyl urea was deposited and the solution of isoimide was obtained. Afterward, 63.79 g (0.096 mol) of 3,3'-diaminodihenylsulfone was added to this solution, and the mixture was then subjected to the reaction at a temperature of 20° to 30° C. for 5 hours. The white precipitate of N,N'-dicyclohexyl urea was removed from the reaction solution by filtration, and the filtrate was then added dropwise to a great deal of acetone, so that a photosensitive polymer was deposited. This deposit was collected by filtration and then dried overnight at 50° C., thereby isolating the photosensitive polymer.

Use Test

In 25.5 g of NMP was dissolved 4.5 g of each of the photosensitive polymers of the present invention synthesized in Examples 1 to 6, and to this solution were further added a photopolymerization initiator, a sensitizer, a diazide compound and/or a compound having a carbon-carbon double bond so as to prepare a photosensitive polymer composition of the present invention. Next, this composition was applied onto a silicon wafer by spin coating, and was then prebaked at 70° C. for 40 minutes in order to form a uniform coating film thereon. Afterward, the coating film was irradiated with an ultra-high pressure mercury vapor lamp (20 mW/cm$^2$) through a mask, irradiation time being varied. The irradiated film was then immersed in a mixed solution of 4 volumes of NMP and 1 volume of ethyl alcohol to develop the film, and the developed coating film was then rinsed in ethyl alcohol, followed by drying, thereby obtaining a sharp relief pattern. Sensitivity was defined as an exposure required until a ratio of a remaining film thickness to an application film thickness became 0.5, and the results of the sensitivity are set forth in Table 1. The thus obtained relief pattern was then calcined at 200° C. for 30 minutes and further at 400° C. for 1 hour in an electric furnace, but at this time, the pattern did not break. According to infrared absorption spectrum, it was confirmed that after the calcination, all the photosensitive polymers were converted into polyimide. Furthermore, in order to inspect the stability with time of these photosensitive polymers, the rotation viscosities of the photosensitive polymer compositions were measured immediately after the preparation and after they were allowed to stand at room temperature for 1 month, in order to examine the change in the rotation viscosities with time. Here, the rotation viscosity referred to above is a viscosity measured at a temperature of 25° C. by the use of an E-type viscometer (made by Tokyo Keiki Co., Ltd.; trade mark VISCONIC EMD). The measured rotation viscosities of the photosensitive compositions in the respective examples are set forth in Table 1.

Comparative Synthesis Example 1

By the use of the same procedure and devices as in Example 1, a polyamic acid solution having an inherent viscosity of 1.1 dl/g was synthesized from 100 g of NMP, 12.34 g (0.0383 mol) of BTDA and 7.66 g (0.0383 mol) of DDE. To this solution was added 14.19 g (0.0766 mol) of dimethylaminoethyl methacrylate in order to prepare a photosensitive polymer solution. Afterward, 30 g of this solution was sampled, and additives shown in Table 1 were added to the sampled solution. Next, a photosensitive test was made as in Use Test, and the stability with time of the photosensitive polymer was measured. The results are set forth in Table 1.

TABLE 1

| | Photosensitive Polymer | Initiator or Sensitizer | | Diazide Compound | | Compound Having Carbon-Carbon Double Bond | |
|---|---|---|---|---|---|---|---|
| Example 1 | polymer in Example 1 | Michler's ketone | 0.2 g | A-1[*1] | 0.3 g | | |
| Example 2 | polymer in Example 2 | Michler's ketone | 0.45 g | A-1 | 0.3 g | M-1[*3] | 0.3 g |
| Example 3 | polymer in Example 3 | benzoinisopropyl ether | 0.2 g | A-1 | 0.5 g | | |
| Example 4 | polymer in Example 4 | 1-nitropyrene | 0.2 g | A-1 | 0.5 g | M-2[*4] | 0.3 g |

TABLE 1-continued

| Example 5 | polymer in Example 5 | 5-nitroace-naphthene | 0.2 g | A-1 | 0.3 g | | M-1 | 0.2 g |
|---|---|---|---|---|---|---|---|---|
| Example 6 | polymer in Example 6 | 2-nitrofluorene | 0.2 g | A-2*² | 0.3 g | | | |
| Example 7 | polymer in Comp. Ex. 1 | Michler's ketone | 0.45 g | | | | | |

| | Sensitivity (film thickness) | Rotation Viscosity (cps) (after 1 month)/ (just after preparation) |
|---|---|---|
| Example 1 | 280 mJ/cm² (3.1 μm) | 330/350 |
| Example 2 | 250 mJ/cm² (2.5 μm) | 410/420 |
| Example 3 | 220 mJ/cm² (4.5 μm) | 230/240 |
| Example 4 | 150 mJ/cm² (1.5 μm) | 510/530 |
| Example 5 | 240 mJ/cm² (4.4 μm) | 440/460 |
| Example 6 | 200 mJ/cm² (3.2 μm) | 400/420 |
| Example 7 | 4600 mJ/cm² (4.2 μm) | 420/1220 |

*¹A-1: 2,6-Di(p-azidobenzal)-4-methylcyclohexanone
*²A-2: 2,6-Di(p-azidobenzal)cyclohexanone
*³M-1: Trimethylolpropane trimethacrylate
*⁴M-2: Pentaerythritol trimethacrylate

What is claimed is:

1. A process for preparing a photosensitive heat-resistant polymer containing a repeating unit represented by the formula (III) which comprises the step of reacting a photosensitive group-containing isoimide represented by the formula (I) with a diamine represented by the formula (II) at a temperature of 0° to 100° C. in the presence of a solvent:

$$\begin{array}{c} D \quad N-R^3 \\ \parallel \quad \parallel \\ C \quad C \\ / \backslash / \backslash \\ O \quad R^1 \quad O \\ \backslash / \backslash / \\ C \quad C \\ \parallel \quad \parallel \\ O \quad O \end{array} \quad (I)$$

$$H_2N-R^2-NH_2 \quad (II)$$

$$\left[ -NH-CO-\underset{\underset{CODH}{|}}{\overset{\overset{CONHR^3}{|}}{R^1}}-CO-NH-R^2- \right] \quad (III)$$

wherein $R^1$ is independently a tetravalent carbon cyclic aromatic group or heterocyclic group; $R^2$ is independently an aliphatic group having at least 2 carbon atoms, an alicyclic group, an aromatic aliphatic group, a carbon cyclic aromatic group, a heterocyclic group or a polysiloxane group; $R^3$ is a monovalent organic group having a photosensitive unsaturated group; and D is an oxygen atom or $=N-R^3$.

2. A process for preparing a photosensitive heat-resistant polymer according to claim 1 wherein said photosensitive group-containing isoimide represented by the formula (I) which is in advance obtained by synthesizing an amic acid from a tetracarboxylic dianhydride represented by the formula (IV) and a monoamine having the photosensitive group represented by the formula (V), and then dehydrating the thus synthesized amic acid with a dehydrating agent:

$$\begin{array}{c} CO \quad CO \\ / \backslash / \backslash \\ O \quad R^1 \quad O \\ \backslash / \backslash / \\ CO \quad CO \end{array} \quad (IV)$$

$$H_2N-R^3. \quad (V)$$

3. A process for preparing a photosensitive heat-resistant polymer according to claim 1 wherein $R^1$ is independently one selected from the group consisting of a non-substituted monocyclic aromatic group, a non-substituted condensed polycyclic aromatic group and a non-substituted non-condensed dicyclic aromatic group.

4. A process for preparing a photosensitive heat-resistant polymer according to claim 1 wherein $R^2$ is independently one selected from the group consisting of a monocyclic aromatic group, a non-condensed dicyclic aromatic group, a non-substituted monocyclic aromatic aliphatic group and a non-substituted aliphatic group having 2 to 10 carbon atoms.

5. A process for preparing a photosensitive heat-resistant polymer according to claim 1 wherein when said photosensitive group-containing isoimide represented by the formula (I) is reacted with said diamine represented by the formula (II), an aminosilane represented by the formula (VII) is introduced into a terminal of said polymer:

$$NH_2-R^7-SiR^8{}_{3-k}X_k \quad (VII)$$

wherein $R^7$ is $-(CH_2)_s-$, $$-(CH_2)_s-\phantom{O}\bigcirc\phantom{O} , \quad -(CH_2)_s-O-\bigcirc\phantom{O} \quad or$$

$$\bigcirc$$

wherein s is an integer of 1 to 4, $R^8$ is independently an alkyl group having 1 to 6 carbon atoms, a phenyl group or an alkyl-substituted phenyl group having 7 to 12 carbon atoms, X is independently a hydrolytic alkoxy group, an acetoxy group or a halogen, and k is a value of $1 \leq k \leq 3$.

6. A process for preparing a photosensitive heat-resistant polymer according to claim 1 wherein when said photosensitive group-containing isoimide represented by the formula (I) is reacted with said diamine represented by the formula (II), a reaction temperature is in the range of from 10° to 30° C.

7. A process for preparing a photosensitive heat-resistant polymer according to claim 1 wherein when said photosensitive group-containing isoimide represented by the formula (I) is reacted with said diamine represented by the formula (II), a reaction time is in the range of from 0.2 to 30 hours.

8. A process for preparing a photosensitive heat-resistant polymer according to claim 1 wherein when said photosensitive group-containing isoimide represented by the formula (I) is reacted with said diamine represented by the formula (II), a reaction time is in the range of from 1 to 10 hours.

* * * * *